(12) United States Patent
Makisako

(10) Patent No.: US 9,455,398 B2
(45) Date of Patent: Sep. 27, 2016

(54) PIEZOELECTRIC ACTUATOR AND MASS FLOW CONTROLLER PROVIDED WITH SAME

(71) Applicant: KYOCERA Corporation, Kyoto-shi, Kyoto (JP)

(72) Inventor: Takuro Makisako, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 23 days.

(21) Appl. No.: 14/403,683

(22) PCT Filed: Oct. 30, 2013

(86) PCT No.: PCT/JP2013/079454
§ 371 (c)(1),
(2) Date: Nov. 25, 2014

(87) PCT Pub. No.: WO2014/069540
PCT Pub. Date: May 8, 2014

(65) Prior Publication Data
US 2015/0179920 A1 Jun. 25, 2015

(30) Foreign Application Priority Data
Oct. 30, 2012 (JP) .................................. 2012-239219

(51) Int. Cl.
*H01L 41/053* (2006.01)
*F16K 31/00* (2006.01)
*G05D 7/06* (2006.01)

(52) U.S. Cl.
CPC ......... *H01L 41/0536* (2013.01); *F16K 31/007* (2013.01); *G05D 7/0635* (2013.01);
(Continued)

(58) Field of Classification Search
CPC ........... H01L 41/0536; H01L 41/0533; H01L 41/053; F16K 31/007; F16K 31/004; G05D 7/0635; Y10T 137/7761; F02M 2200/21
USPC ...................................................... 137/487.5
See application file for complete search history.

(56) References Cited

U.S. PATENT DOCUMENTS 5,239,223 A * 8/1993 Miyoshi .............. H01L 41/0536
310/328
5,334,902 A * 8/1994 Inoi ....................... H01L 41/053
310/328

(Continued)

FOREIGN PATENT DOCUMENTS

JP 3-082315 A 4/1991
JP 6-334233 A 12/1994

(Continued)

OTHER PUBLICATIONS

International Search Report, PCT/JP2013/079454, Jan. 6, 2014, 1 pg.

(Continued)

*Primary Examiner* — Mary McManmon
*Assistant Examiner* — Patrick Williams
(74) *Attorney, Agent, or Firm* — Volpe and Koenig, P.C.

(57) ABSTRACT

A piezoelectric actuator of the invention includes: a piezoelectric element; a base body having an upper surface which is in contact with a lower end portion of the piezoelectric element; and a case having an inner surface which is in contact with an upper end portion of the piezoelectric element, the case storing the piezoelectric element therein, the upper surface of the base body and the case being joined to each other. The case includes a cylindrical portion including a cylindrical main body and a plurality of grooves formed all around a perimeter thereof, and a collar portion disposed at a lower end side of the cylindrical portion. At least one of the plurality of grooves has a sectional profile taken along a plane perpendicular to a vertical direction whose oblateness differs from that of a sectional profile of the cylindrical main body.

4 Claims, 6 Drawing Sheets

(52) U.S. Cl.
CPC ......... *H01L41/053* (2013.01); *H01L 41/0533* (2013.01); *F02M 2200/21* (2013.01); *Y10T 137/7761* (2015.04)

(56) References Cited

U.S. PATENT DOCUMENTS

| | | | |
|---|---|---|---|
| 7,429,815 B2* | 9/2008 | Gibson | ................ F02M 47/027 310/344 |
| 2007/0295832 A1 | 12/2007 | Gibson et al. | |
| 2010/0193056 A1* | 8/2010 | Igarashi | .................... G01F 1/42 137/613 |

FOREIGN PATENT DOCUMENTS

| JP | 11-022845 A | 1/1999 |
|---|---|---|
| JP | 11-280961 A | 10/1999 |

OTHER PUBLICATIONS

Chinese Office Action with English concise explanation, Chinese Patent Application No. 201380026012.5, Jun. 28, 2016, 8 pgs.

* cited by examiner

PIEZOELECTRIC ACTUATOR AND MASS FLOW CONTROLLER PROVIDED WITH SAME

TECHNICAL FIELD

The present invention relates to a piezoelectric actuator for use in, for example, a fuel injection device of an automotive engine; a liquid injection apparatus such as an ink-jet unit; a precise positioning device of XY table; a valve controller for gas flow adjustment; an autofocusing mechanism, a zoom mechanism, and an image stabilizer of a camera; a head positioning controller of a hard disk drive; an optical-axis adjuster and a focus adjuster of optical equipment; and a mass flow controller, and also relates to a mass flow controller provided with the same.

BACKGROUND ART

As a piezoelectric actuator, for example, there is known a construction obtained by enclosing, in a metal-made container, a piezoelectric element comprising: a columnar staked body including a plurality of piezoelectric layers and internal electrode layers laminated; and a pair of external electrodes attached to side surfaces of the stacked body so as to extend in a stacking direction thereof, respectively, each of the external electrodes being electrically connected to every second one of the internal electrode layers in an alternate manner (refer to Patent Literature 1, for example).

CITATION LIST

Patent Literature

Patent Literature 1: Japanese Unexamined Patent Publication JP-A 6-334233 (1994)

SUMMARY OF INVENTION

Technical Problem

In a piezoelectric actuator comprising: a piezoelectric element; a base body having and upper surface which is in contact with a lower end of the piezoelectric element; and a case having an inner surface which is in contact with an upper end of the piezoelectric element, the case storing the piezoelectric element therein, the case and the upper surface of the base body being joined to each other, it is preferable that the case comprises: a cylindrical portion having a plurality of grooves formed all around a perimeter thereof; and a collar portion disposed at a lower end of the cylindrical body, because, in this construction, the case can conform to expansion and contraction of the piezoelectric element, and is also easily manufactured.

The above-described piezoelectric actuator is constructed by joining the case comprising the cylindrical portion and the collar portion to the base body by means of laser welding, resistance welding, brazing, or otherwise under a condition where a compressive load is applied to the piezoelectric element so that the piezoelectric element can be constantly subjected to compressive stress.

In this construction, however, there is a problem that a stress load resulting from tensile stress is applied to a junction between the base body and the collar portion and, as a result, fatigue failure in the junction may occur.

Furthermore, in a mass flow controller which exercises flow control by exploiting expansion and contraction of the piezoelectric actuator, there is a problem that, due to the fatigue failure of the junction in the piezoelectric actuator, the mass flow controller cannot be operated stably for a long period of time.

The invention has been devised in view of the problems as mentioned supra, and accordingly an object of the invention is to provide a piezoelectric actuator capable of suppressing occurrence of fatigue failure in a junction caused by tensile stress, and a mass flow controller provided with the same.

Solution to Problem

The invention provides a piezoelectric actuator comprising: a piezoelectric element; a base body having an upper surface which is in contact with a lower end portion of the piezoelectric element; and a case having an inner surface which is in contact with an upper end portion of the piezoelectric element, the case storing the piezoelectric element therein, the upper surface of the base body and the case being joined to each other, the case including a cylindrical portion including a cylindrical main body and a plurality of grooves formed all around a perimeter thereof, and a collar portion disposed at a lower end side of the cylindrical portion, at least one of the plurality of grooves having a sectional profile taken along a plane perpendicular to a vertical direction whose oblateness differs from that of a sectional profile of the cylindrical main body.

Moreover, the invention provides a mass flow controller comprising: a flow channel; a flow sensor section configured to detect a flow rate of a fluid flowing through an interior of the flow channel; a flow control valve provided with the above-described piezoelectric actuator, the flow control valve controlling a flow rate of a fluid; and a control circuit section, the flow control valve exercising flow rate control by exploiting expansion and contraction of the piezoelectric actuator.

Advantageous Effects of Invention

According to the piezoelectric actuator of the invention, when stress is caused by expansion and contraction, there arise variations in the time of stress application, wherefore stress can be distributed. This makes it possible to reduce the stress applied to a junction, and thereby render the junction less prone to fatigue failure.

Moreover, according to the mass flow controller of the invention, it is possible to suppress occurrence of fatigue failure in the junction caused by continuous driving of the piezoelectric actuator, and thereby drive the piezoelectric actuator stably for a long period of time, wherefore the mass flow controller is excellent in durability and can thus be operated stably for a long period of time.

DESCRIPTION OF EMBODIMENTS

Hereinafter, one embodiment of a piezoelectric actuator of the invention will be described with reference to drawings.

Figure 1:
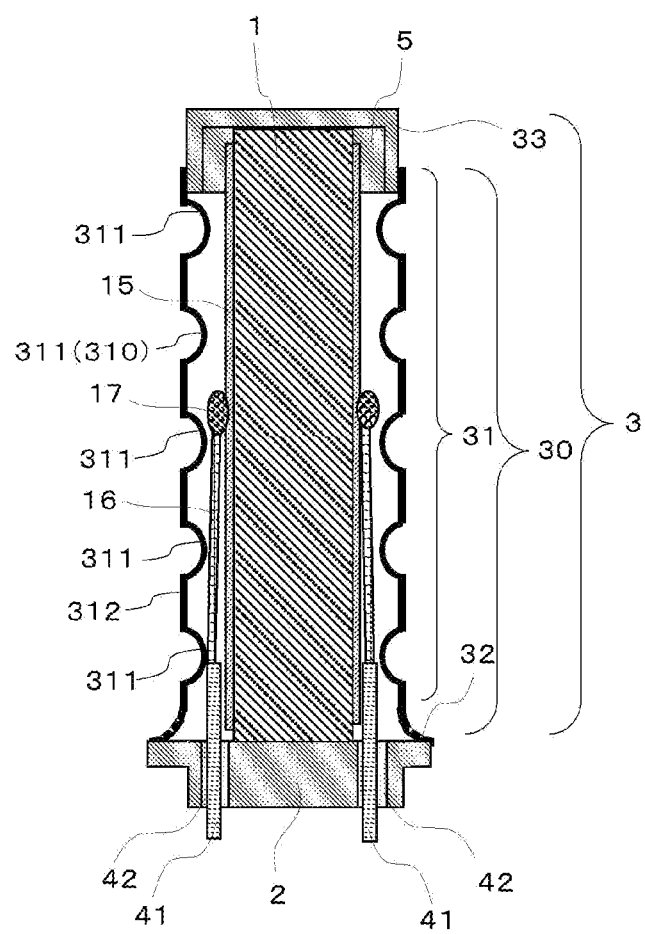
FIG. 1 is a vertical sectional view showing one embodiment of a piezoelectric actuator of the invention.
Figure 2:
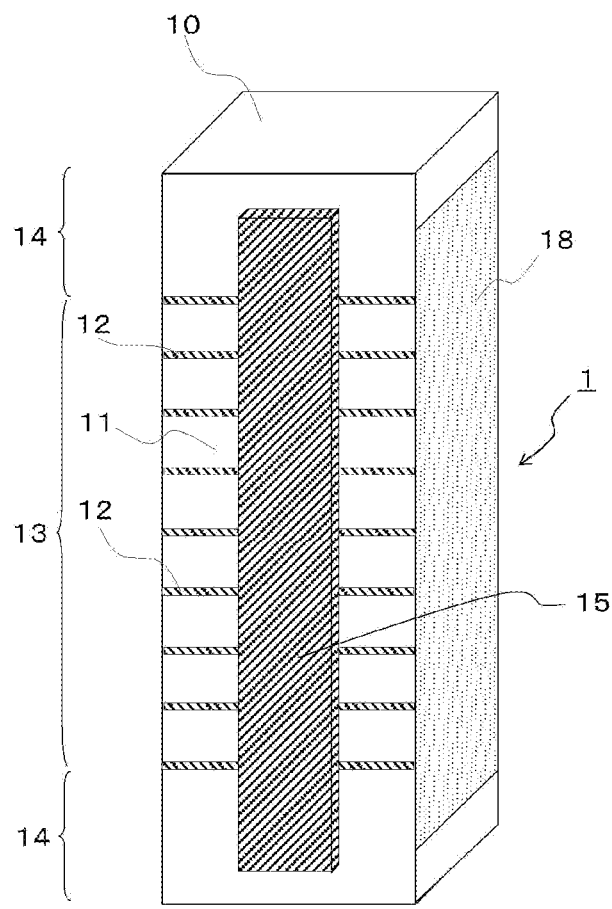
FIG. 2 is a schematic perspective view of a piezoelectric element shown in FIG. 1.

FIG. 1 is a vertical sectional view showing one embodiment of a piezoelectric actuator of the invention; FIG. 2 is a schematic perspective view of a piezoelectric element shown in FIG. 1; FIG. 3(a) is a vertical sectional view showing one embodiment of the piezoelectric actuator of the invention; FIG. 3(b) is a schematic sectional view taken along the line A-A shown in FIG. 3(a); and FIG. 3(c) is a schematic sectional view taken along the line B-B shown in FIG. 3(a).

The piezoelectric actuator of the invention comprises: a piezoelectric element 1; a base body 2 having an upper surface which is in contact with a lower end of the piezoelectric element 1; and a case 3 having an inner surface which is in contact with an upper end of the piezoelectric element 1, the case storing the piezoelectric element 1 therein, in which the upper surface of the base body 2 and the case 3 are joined to each other. The case 3 comprises: a cylindrical portion 31 including a cylindrical main body 312 and a plurality of grooves 311 formed all around a perimeter thereof, and a collar portion 32 disposed at a lower end of the cylindrical portion 31. Moreover, at least one groove 310 of the plurality of grooves 311 has a sectional profile taken along a plane perpendicular to a vertical direction whose oblateness differs from that of a sectional profile of the cylindrical main body 312.

As shown in FIG. 2, the piezoelectric element 1 is a multi-layer piezoelectric element which comprises, for example, a stacked body 10 including an active section 13 including a plurality of piezoelectric layers 11 and internal electrode layers 12 alternately laminated, and an inactive section 14 formed of the piezoelectric layer 11, the inactive section 14 being disposed at each end of the active section 13 in a stacking direction thereof. The active section 13 is a part where the piezoelectric layer 11 expands or contracts in the stacking direction during driving operation, whereas the inactive section 14 is a part where the piezoelectric layer 11 undergoes neither expansion nor contraction in the stacking direction during driving operation.

The stacked body 10 constituting the piezoelectric element 1 has a rectangular parallelepiped shape which is approximately, for example, 4 to 7 mm in length, 4 to 7 mm in width, and 20 to 50 mm in height. Note that, although the stacked body 10 shown in FIG. 2 has the shape of a quadrangular prism, it may have the shape of, for example, a hexagonal prism or octagonal prism instead.

A plurality of the piezoelectric layers 11 constituting the stacked body 10 are made of piezoelectric porcelain (piezoelectric ceramics) having piezoelectric properties, and the piezoelectric ceramics have an average particle size in a range of 1.6 to 2.8 µm, for example. As the piezoelectric porcelain, for example, a perovskite-type oxide made of lead zirconate titanate ($PbZrO_3$—$PbTiO_3$) or the like, or lithium niobate ($LiNbO_3$), lithium tantalate ($LiTaO_3$) or the like can be used.

Moreover, the internal electrode layers 12 are made of, for example, silver, a silver-palladium alloy, a silver-platinum material, copper, or the like, and are arranged so that positive electrodes and negative electrodes (or grounding electrodes) are led out to a pair of opposed side surfaces of the stacked body 10 in a staggered manner. According to this structure, in the active section 13, a driving voltage is applied to the piezoelectric layer 11 sandwiched between the internal electrode layers 12 arranged adjacent to each other in the stacking direction.

The stacked body 10 may include a metallic layer or the like which does not serve as the internal electrode layer 12 but serves as a stress relaxation layer.

An external electrode 15 is disposed on each of the paired opposed side surfaces of the stacked body 10 to which the positive electrodes and the negative electrodes (or grounding electrodes) of the internal electrode layers 12 are led out in a staggered manner, and, the external electrode 15 is joined to the led-out internal electrode layers 12. The external electrode 15 is a metallized layer made of, for example, a sintered body of silver and glass, and is caused to be electrically conducting with the internal electrode layers 12. As shown in FIG. 1, a lead wire 16 is attached to the external electrode 15 by solder 17 (electrically-conductive adhesive), so that application of driving voltage can be effected via the lead wire 16.

Meanwhile, at the other pair of opposed side surfaces of the stacked body 10, the positive electrodes and the negative electrodes (or grounding electrodes) of the internal electrode layers 12 are left exposed, and, an oxide-made cover layer 18 is formed on these side surfaces. The formation of the cover layer 18 makes it possible to prevent creeping discharge which occurs between the electrodes when a high voltage is applied during driving operation. Exemplary of the oxide constituting the cover layer 18 is a ceramic material, in particular, a material which can conform to driving-induced deformation (expansion and contraction) of the stacked body 10 during driving operation of the piezoelectric actuator, and can become deformed under stress in order to avoid separation of the cover layer 18 that may cause creeping discharge. Specific examples thereof include a ceramic material such as partially stabilized zirconia or a substance defined as: $Ln_{1-x}Si_xAlO_{3+0.5x}$ (wherein Ln represents at least one selected from Sn, Y, La, Ce, Pr, Nd, Pm, Sm, Eu, Gd, Tb, Dy, Ho, Er, Tm, and Yb, and x=0.01 to 0.3) that can become deformed as the result of local phase transformation and volume change entailed by development of stress; and a piezoelectric material such as barium titanate or lead zirconate titanate in which an interionic distance within a crystalline lattice is caused to vary for relaxation of the developed stress. The cover layer 18 is formed by processing the material used for the cover layer into ink form, applying the ink onto the side surfaces of the stacked body 10 by means of dipping or screen printing, and performing sintering.

The piezoelectric actuator shown in FIG. 1 comprises: the base body 2 having the upper surface which is in contact with the lower end portion of the piezoelectric element 1;

and the case 3 having the inner surface which is in contact with the upper end portion of the piezoelectric element 1, the case storing the piezoelectric element 1 therein.

Specifically, the base body (lower lid member) 2 is constructed by shaping a metal material such as SUS 304 (the JIS standard of austenitic stainless steel) or SUS 316L (the JIS standard of austenitic stainless steel) into a circular plate, and, in the drawing, the base body is illustrated as having a thin-walled outer edge. Moreover, the base body 2 is formed with two through holes 2 through which lead pins 41 can be inserted, so that electrical conduction between the external electrode 15 and the exterior thereof can be established by inserting the lead pin 41 electrically connected to the lead wire 16 into the through hole. Furthermore, soft glass 42 is filled in a gap at the through hole 2 in order to secure the lead pin 41, as well as to prevent the entry of outside air.

Meanwhile, the case 3 is, like the base body 2, made of a metal material such as SUS 304 or SUS 316L, and comprises a cylindrical body 30, and a circular-plate shaped lid member (upper lid member) 33 disposed so as to block an opening of the cylindrical body 30 located at one end thereof.

The cylindrical body 30 constituting the case 3 includes the cylindrical portion 31 having the plurality of grooves 311 formed all around the perimeter thereof, and the collar portion 32 disposed at the lower end side of the cylindrical portion 31. The cylindrical portion 31 is a part of a cylinder form which extends rectilinearly in the vertical direction and includes the cylindrical main body 312 and the plurality of the grooves 311 (including the groove 310) formed all around the perimeter thereof. Moreover, the collar portion 32 is a part which is formed integrally with the cylindrical portion 31 while being continuous with the lower end of the cylindrical portion 31 (the lower end of the rectilinearly extending part). More specifically, the collar portion 32 is a bend which is continuous with the lower end of the cylindrical portion 31, extends rectilinearly in a horizontal direction, and extends outwardly in a radial direction in so-called trumpet form. Note that the cylindrical main body 312 refers to a part of the cylindrical portion 31 except for the grooves.

The cylindrical body 30 is formed by producing a seamless tube of a predetermined shape, then shaping the seamless tube into bellows form by means of rolling, isostatic pressing, or otherwise, and forming the grooves 311 and the groove 310. Moreover, the cylindrical body 30 has a predetermined spring constant so as to conform to expansion and contraction of the piezoelectric element 1 (stacked body 10) when a voltage is applied to the piezoelectric element 1, and, the spring constant is adjusted in accordance with the thickness, and the shape and number of the grooves.

Moreover, the lid member 33 constituting the case 3 is designed so that its outer diameter is substantially equal to the inner diameter of the cylindrical body 30, and is fitted in the opening of the cylindrical body 30 located at one end thereof, with its outer periphery joined to an inner wall near the one end-sided opening. The inner surface of the lid member 33 is formed with a recess against which the upper end of piezoelectric element 1 abuts. Besides, an insulating member 5 is provided so as to cover the inner peripheral wall surface of the recess, thereby avoiding that the paired external electrodes 15 of the piezoelectric element 1 are brought into direct contact with the inner surface of the lid member 33. This makes it possible to prevent electrical short-circuiting between the external electrodes 15.

Although the cylindrical body 30 and the lid member 33 are separate components that are joined to each other, they may be formed integrally with each other.

Figure 3:
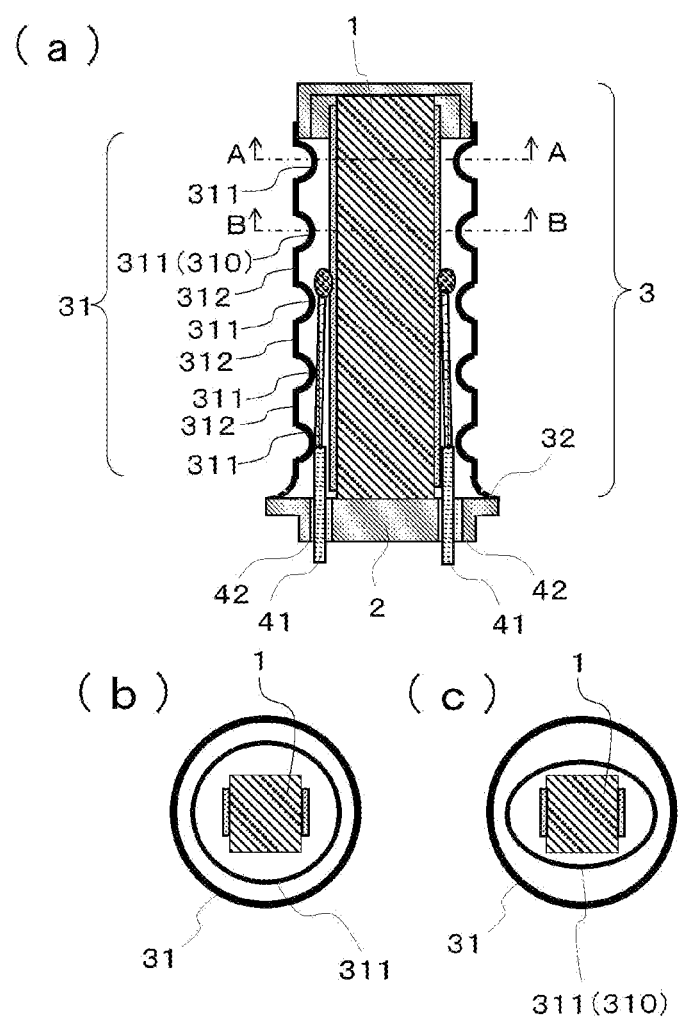
FIG. 3(a) is a vertical sectional view showing one embodiment of the piezoelectric actuator of the invention.
FIG. 3(b) is a schematic sectional view taken along the line A-A shown in FIG. 3(a)
FIG. 3(c) is a schematic sectional view taken along the line B-B shown in FIG. 3(a)

Then, the upper surface of the base body 2 and the case 3 are joined to each other at a junction. Moreover, as shown in FIG. 3, in the case 3 (cylindrical body 30), at least one groove 310 of the plurality of the grooves 311 formed all around the perimeter of the cylindrical portion 31 has the sectional profile taken along a plane perpendicular to the vertical direction whose oblateness differs from that of the sectional profile of the cylindrical main body 312.

For example, the sectional profile of the at least one groove 310 is defined by an ellipse, whereas the sectional profile of the cylindrical main body 312 is defined by a circle. The oblateness of an ellipse is expressed as: (major radius a−minor radius b)/major radius a. In the drawing, a groove having an elliptical sectional profile whose oblateness differs from that of the sectional profile of the cylindrical main body 312 is illustrated as the groove 310.

In a case where a plurality of the grooves 311 each have a sectional profile of circle when taken along a plane perpendicular to the vertical direction, stress is applied all at once. On the other hand, according to the construction of the invention, when stress is caused by expansion and contraction, there arises a difference in the time of stress application between the major-axis side and the minor-axis side of the groove having an elliptical sectional profile, wherefore stress can be distributed. This makes it possible to reduce the stress applied to the junction, and thereby render the junction less prone to fatigue failure, with the result that the piezoelectric actuator can be driven with stability for a long period of time. Given that the major axis is 8 to 10 mm in length for example, then it is advantageous to adjust the length of the minor axis to be equal to 90 to 99% of the length of the major axis. Note that the profile whose oblateness differs from that of the profile of other part (elliptical profile) is not limited to a geometrically symmetric ellipse, but may be of a slightly skewed ellipse.

As used herein, "the oblateness of the sectional profile of at least one groove 310 of the plurality of the grooves 311 taken along a plane perpendicular to the vertical direction" refers to the oblateness of the contour of the groove 310 as seen when the cylindrical portion 31 is sectioned at, at least one groove 310 of the plurality of the grooves 311 along a plane perpendicular to the vertical direction.

Figure 4:
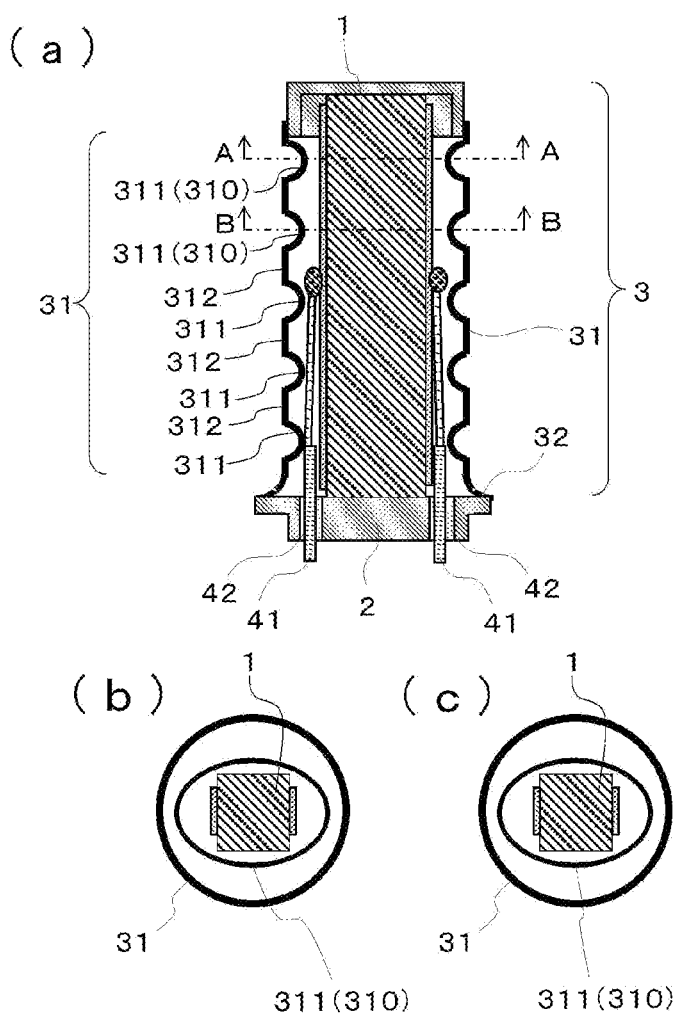
FIG. 4(a) is a vertical sectional view showing another embodiment of the piezoelectric actuator of the invention.
FIG. 4(b) is a schematic sectional view taken along the line A-A shown in FIG. 4(a)
FIG. 4(c) is a schematic sectional view taken along the line B-B shown in FIG. 4(a)

In the piezoelectric actuator of the invention, as shown in FIG. 4, it is preferable that two or more of the plurality of grooves 310 each have a sectional profile whose oblateness differs from that of the sectional profile of the cylindrical main body 312. It is particularly preferable that the sectional profiles of all the grooves differ in oblateness from the sectional profile of the cylindrical main body 312.

According to this construction, since the stress resulting from expansion and contraction of the cylindrical portion 31 can be distributed more readily, it is possible to achieve further reduction of the stress applied to the junction, and thereby attain higher resistance to fatigue failure.

Figure 5:
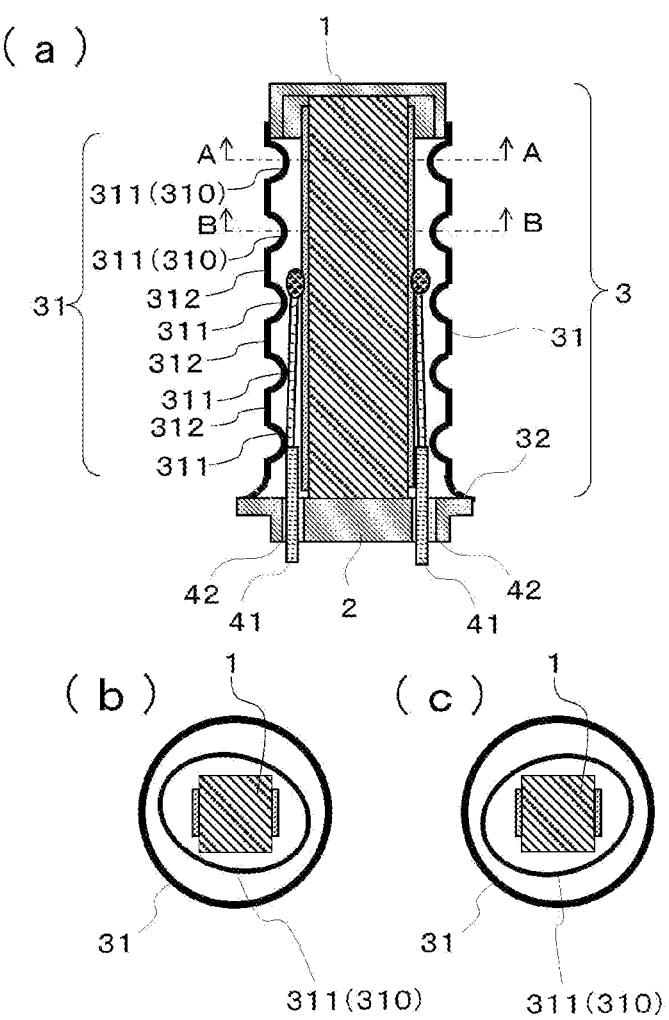
FIG. 5(a) is a vertical sectional view showing another embodiment of the piezoelectric actuator of the invention.
FIG. 5(b) is a schematic sectional view taken along the line A-A shown in FIG. 5(a)
FIG. 5(c) is a schematic sectional view taken along the line B-B shown in FIG. 5(a)

Moreover, in the piezoelectric actuator of the invention, as shown in FIG. 5, it is preferable that the two or more of the plurality of the grooves 310 each having a sectional profile whose oblateness differs from that of the sectional profile of the cylindrical main body 312, vary in terms of orientation of the profile's major axis.

According to this construction, it is possible to cause complicated variations in the time of stress application among the plurality of the grooves 310, and thereby further distribute stress. Therefore, the stress applied to the junction can be reduced even further, and thus the junction can be made less prone to fatigue failure.

Figure 6:
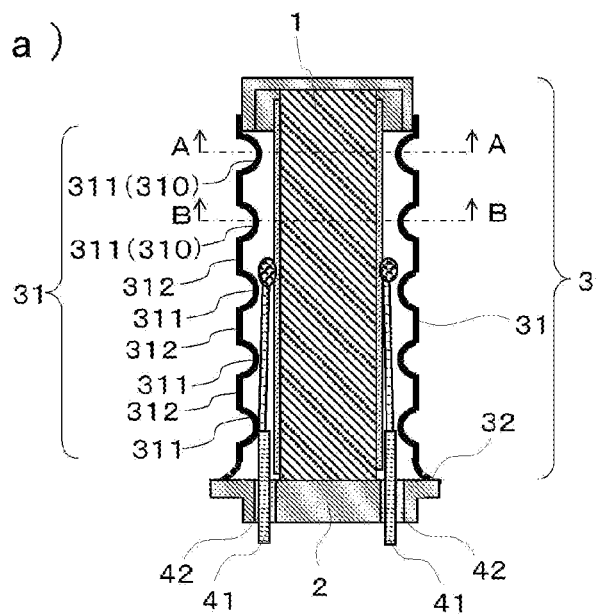
FIG. 6(a) is a vertical sectional view showing another embodiment of the piezoelectric actuator of the invention.
FIG. 6(b) is a schematic sectional view taken along the line A-A shown in FIG. 6(a)
FIG. 6(c) is a schematic sectional view taken along the line B-B shown in FIG. 6(a)
Figure 6:
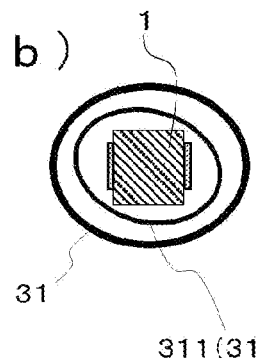
Figure 6:
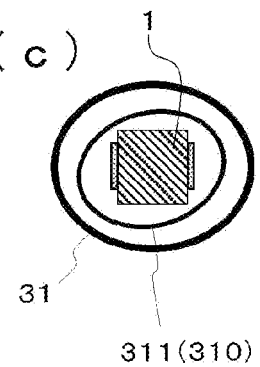

Moreover, in the piezoelectric actuator of the invention, as shown in FIG. 6, it is preferable that the grooves 310 have a sectional profile of ellipse, and that the cylindrical main body 312 of the cylindrical portion 31 has a sectional profile of ellipse. In other words, the cylindrical portion 31 is preferably designed so that the groove 310-free region thereof also has a sectional profile of ellipse. Since the groove 310-free region of the cylindrical portion 31 has a sectional profile of ellipse, it is possible to obtain the same effects as described above, as well as to render the junction less prone to fatigue failure.

With a compressive load applied to the piezoelectric element 1, the collar portion 32 of the case 3 and the base body 2 are joined to each other, and, the piezoelectric element 1 is enclosed, together with an inert gas, in a housing space formed by the case 3 and the base body 2, thereby constituting the piezoelectric actuator. It is preferable that the piezoelectric actuator includes, as the junction, an annular portion which is located between the lower surface of the collar portion 32 and the upper surface of the base body 2, with its at least one of upper and lower surfaces joined to the lower surface of the collar portion 32 or the upper surface of the base body 2.

Next, a method for manufacturing the piezoelectric actuator in accordance with the present embodiment will be described.

First, ceramic green sheets for forming the piezoelectric layers 11 are prepared. Specifically, calcined powder of piezoelectric ceramics, a binder made of an organic high polymer such as acrylic polymer or butyral polymer, and a plasticizer are mixed to prepare a ceramic slurry. The ceramic slurry is shaped into ceramic green sheets by a heretofore known tape molding technique such as the doctor blade method or the calender roll method. The piezoelectric ceramics may be of any given type so long as it has piezoelectric properties, and, for example, a perovskite-type oxide made of $PbZrO_3$—$PbTiO_3$ can be used. Moreover, as the plasticizer, dibutyl phthalate (DBP), dioctyl phthalate (DOP), or the like can be used.

Next, an electrically-conductive paste for forming the internal electrode layers 12 is prepared. Specifically, the electrically-conductive paste is prepared by admixing a binder and a plasticizer in metal powder of a silver-palladium alloy. Printing is performed with this electrically-conductive paste onto the above-described ceramic green sheet by means of screen printing, and subsequently a plurality of ceramic green sheets bearing the printed electrically-conductive paste are laminated on top of each other, and, a laminate of a plurality of ceramic green sheets free from the printed electrically conducting paste is placed at each end of the resultant product in the stacking direction, whereupon a lamination molded product is obtained. This lamination molded product is subjected to debinding, or binder removal treatment at a predetermined temperature, and is then fired at a temperature in a range of 900 to 1200° C., whereupon the stacked body 10 is obtained.

Next, the cover layer 18 is formed by printing an ink of oxide on the paired side surfaces of the stacked body 10 to which the internal electrode layers 12 (both of positive and negative electrodes) are led out by means of screen printing, and then firing it at a temperature in a range of 900 to 1200° C. The ink of oxide is prepared by dispersing oxide powder in a solution of a solvent, a dispersant, a plasticizer and a binder, and then pulverizing aggregation of the powder while dispersing the powder by passing a three-roll mill through it over several times.

Next, the external electrode 15 composed of a metallized layer is formed. To begin with, a binder is added to silver particles and glass powder to prepare a silver-glass containing electrically-conductive paste, and printing is performed with the paste onto the paired opposed side surfaces of the stacked body 10 to which the positive or negative electrodes of the internal electrode layers 12 are led out, by means of screen printing, and subsequently baking treatment is performed thereon at a temperature in a range of about 500 to 800° C. In this way, the external electrode 15 composed of a metallized layer is formed, and, the production of the piezoelectric element 1 is completed.

Next, the external electrode 15 and the lead wire 16 are soldered to each other with the solder 17. Moreover, there is prepared the base body (lower lid member) 2 having a shape as shown in FIG. 1 which has an annular portion formed by cutting operation and through holes formed by hole-drilling operation, and, the lead pin 41 is inserted into each of the two through holes formed in the base body (lower lid member) 2, and the gap therebetween is filled with the soft glass 42 for securement of the lead pin 41, and also the lower end of the piezoelectric element 1 is bonded to the upper surface of the base body 2 with an adhesive. Then, the lead wire 16 soldered to the external electrode 15 with the solder 17 and the lead pin 41 attached to the base body 2 are connected to each other by means of solder.

Next, the seamless cylindrical body 30 made of SUS 304 is processed into bellows form by grooving operation, thereby constituting the cylindrical portion 31 comprising the cylindrical main body 312 and a plurality of grooves 311 (including the groove 310) formed all around the perimeter thereof. At this time, by designing a mold for grooving to have an elliptical shape whose oblateness differs from that of the sectional profile of the cylindrical main body 312, it is possible to form the groove 310 having an elliptical sectional profile taken along a plane perpendicular to the vertical direction whose oblateness differs from that of the sectional profile of the cylindrical main body 312. Moreover, by rotating the cylindrical body 30 every time the elliptical sectional-profile groove 310 is formed, it is possible to produce the cylindrical body 30 having a plurality of elliptical sectional-profile grooves that vary in terms of orientation of the ellipse's major axis. Furthermore, in order to design the cylindrical portion 31 so that its region free from a plurality of elliptical sectional-profile grooves has also an elliptical sectional profile, it is advisable to adopt an elliptical sectional-profile cylindrical member as the cylindrical body 30 which is subjected to drawing operation.

The lid member (upper lid member) 33 made of SUS 304 is welded by means of laser welding so as to block an opening of the cylindrical body 30 located at one end (upper end) thereof, whereupon the case 3 is produced. Moreover, the collar portion 32 is formed at the other end (lower end) of the cylindrical body 30 by means of resistance welding.

Next, the case 3 is put so as to cover the piezoelectric element 1 bonded to the base body 2, and a load is applied to the piezoelectric element 1 by pulling the case 3 with a predetermined load. Under this condition, the collar portion 32 of the case 3 and the upper surface of the annular portion disposed on the base body 2 are welded to each other by means of resistance welding, thereby enclosing the piezoelectric element 1. In a case where a member made of a material which is different from that used for the base body is used as the annular portion, it is advisable to prepare a ring which serves as the annular portion, the upper surface of which is welded to the collar portion 32, and the lower surface of which is welded to the base body 2.

Next, a hole for the admission of an inert gas is formed in a predetermined position of the case 3 by a drill, and, after the release of oxygen from the case (housing space) by evacuation of a vacuum chamber, a nitrogen gas is admitted into the vacuum chamber to effect nitrogen purging in the interior of the case (housing space). After that, the hole for the admission of an inert gas is blocked by means of laser welding.

Lastly, a DC electric field of 0.1 to 3 kV/mm is applied to the lead pin 41 attached to the base body 2 for polarization of the stacked body 10, whereupon the production of the piezoelectric actuator of the present embodiment is completed. Then, the lead pin 41 and an external power source are connected to each other for application of a voltage to the piezoelectric layers 11, so that each of the piezoelectric layers 11 can undergo significant displacement under an inverse piezoelectric effect. Accordingly, the piezoelectric actuator can be operated as an automotive fuel injection valve capable of supplying a jet of fuel into an engine, for example.

The multi-layer piezoelectric element of the present embodiment is used for, for example, a fuel injection device of an automotive engine; a liquid injection apparatus such as an ink-jet unit; a precise positioning device of optical equipment; a valve controller for gas flow adjustment; an autofocusing mechanism, a zoom mechanism, and an image stabilizer of a camera; a head positioning controller of a hard disk drive; an optical-axis adjuster and a focus adjuster of optical equipment; a mass flow controller; and so forth.

Figure 7:
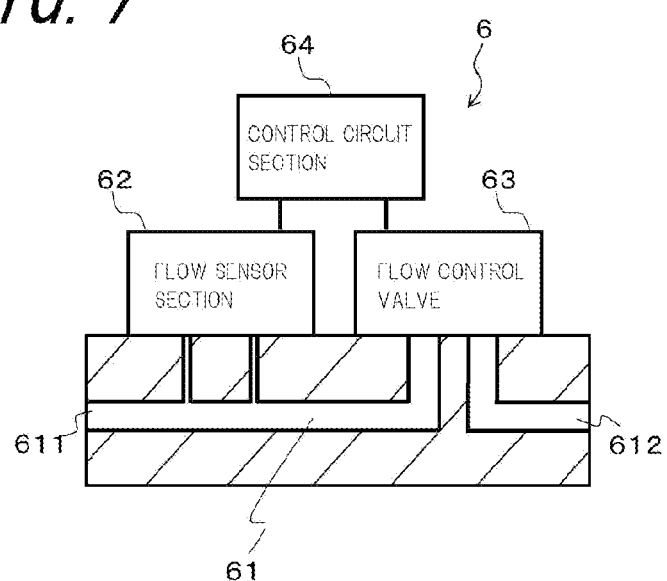
FIG. 7 is a view showing the structure of an embodiment of a mass flow controller.

Next, a mass flow controller provided with the piezoelectric actuator thus far described will be explained with reference to FIG. 7. FIG. 7 is a view showing the structure of an embodiment of the mass flow controller.

The mass flow controller 6 as shown in FIG. 7 comprises: a flow channel 61; a flow sensor section 62 configured to detect the flow rate of a fluid flowing through an interior of the flow channel 61; a flow control valve 63 provided with the above-described piezoelectric actuator, the flow control valve controlling the flow rate of a fluid; and a control circuit section 64, the flow control valve 63 exercising flow rate control by exploiting expansion and contraction of the piezoelectric actuator.

The flow channel 61 is designed to allow, for example, a fluid such as a gas to flow therethrough, and, the fluid enters through an inlet 611 and exits from an outlet 612.

The channel 61 is partly connected to the flow sensor section 62 by way of, for example, a bypath, so that the flow sensor section 62 can detect the flow rate (mass flow rate) of a fluid flowing through the interior of the channel 61.

A flow rate signal detected by the flow sensor section 62 is amplified by an amplifier circuit or otherwise, and is then transmitted to the control circuit section 64.

In the control circuit section 64, a comparison is made between the flow rate signal transmitted to the control circuit section 64 and a predetermined flow rate signal.

Then, a driving signal (driving voltage) capable of cancelling out the difference between the transmitted flow rate signal and the predetermined flow rate signal is inputted to the piezoelectric actuator constituting the flow control valve 63.

The piezoelectric actuator expands and contracts in response to the inputted driving voltage, and, the amount of opening and closing of the flow control valve 63 is adjusted on the basis of the expansion and contraction, thereby controlling the flow rate of a fluid passing through the channel 61.

As described heretofore, it is possible to suppress occurrence of fatigue failure at the root of the groove caused by continuous driving of the piezoelectric actuator, and thereby drive the piezoelectric actuator stably for a long period of time, wherefore the mass flow controller of this embodiment is excellent in durability and can thus be operated stably for a long period of time.

EXAMPLES

As an example of the invention, a piezoelectric actuator was produced in the following manner.

To begin with, a ceramic slurry was prepared by mixing calcined powder of piezoelectric ceramics composed predominantly of lead zirconate titanate ($PbZrO_3$—$PbTiO_3$) having an average particle size of 0.4 µm, a binder, and a plasticizer, and, the ceramic slurry was shaped into a ceramic green sheet for forming a 150 µm-thick piezoelectric layer by the doctor blade method.

Pringing was performed with an electrically-conductive paste for forming the internal electrode, which was prepared by adding a binder to a silver-palladium alloy (having a silver content of 95% by mass and a palladium content of 5% by mass), onto one side of the ceramic green sheet by means of screen printing, and, 260 ceramic green sheets thereby obtained were laminated on top of each other, and then a laminate of 20 ceramic green sheets free from the electrically-conductive paste was placed at each of the top and the bottom of the resultant product, whereupon a lamination molded product was produced.

Next, the lamination molded product was cut into a predetermined size by a dicing saw machine, and the lamination molded product was then dried and fired, whereupon a stacked body was produced. In the firing process, the lamination molded product has been left for 90 minutes while maintaining the temperature at 800° C., and whereafter fired at 1000° C. for 200 minutes. The resultant stacked body was given a rectangular parallelepiped shape having end faces that are each 5 mm in length and 5 mm in width, the height of which is 35 mm.

Next, an ink was prepared from partially stabilized zirconia, a piezoelectric material, the same material as that used for the piezoelectric layer, and lead zirconate titanate, and, printing was performed with the ink onto the side surfaces of the stacked body, where both of the electrodes of the internal electrode layers are left exposed, by means of screen printing in such a manner as to obtain a 20 µm-thick cover layer, and subsequently the printed product has been fired at 1000° C., whereupon a cover layer was formed on each side surface of the stacked body.

Next, a silver-glass containing electrically-conductive paste was prepared by adding a binder to silver particles and glass powder, and printing was performed with the paste on the side surface of the stacked body by means of screen printing, and then baked at a temperature in a range of about 500 to 800° C., whereupon an external electrode was formed, and subsequently a lead wire was connected to the external electrode by means of soldering.

Moreover, a circular-plate shaped base body was prepared from SUS 304. Specifically, there was produced a base body in a shape as shown in FIG. 1 which has an annular portion obtained by cutting operation and through holes formed in two places thereof. Then, a lead pin was inserted into each of the through holes formed in the base body and fixed in place by soft glass. Moreover, a thickness of the annular portion was 50 μm.

Next, the stacked body (piezoelectric element) was secured to the upper surface of the base body with an adhesive, and, the lead wire soldered to the external electrode and the lead pin attached to the base body were connected to each other by means of soldering.

Next, a circular-plate shaped upper lid member was prepared from SUS 304. Moreover, a case was constructed by welding, through laser welding operation, the upper lid member to a cylindrical body obtained by processing a SUS 316L-made seamless cylinder into bellows form by grooving operation so as to have a collar portion, and, the case was put so as to cover the piezoelectric element bonded to the base body (lower lid member). Then, a load was applied to the piezoelectric element by pulling the case with a predetermined load, and subsequently the case and the annular portion of the base body were welded to each other at their abutting areas by means of resistance welding, thereby enclosing the piezoelectric element.

Where grooves formed all around the perimeter of the case are concerned, five grooves were spaced 4 mm apart in the vertical direction, and, all the grooves had a sectional profile of ellipse when taken along a plane perpendicular to the vertical direction, and, the ellipses defining the profiles of the grooves differ in oblateness from the sectional profile of other part (cylindrical main body), are 9 mm in major axis length and 8.4 mm in minor axis length, and vary in terms of major axis orientation.

Next, a hole for the admission of an inert gas was formed in a predetermined position of the case by a drill, and, after the release of oxygen from the case (housing space) by evacuation of a vacuum chamber, a nitrogen gas was admitted into the vacuum chamber to effect nitrogen purging in the interior of the case (housing space). After that, the hole for nitrogen purging was blocked by means of laser welding, whereupon the nitrogen purging was finished.

In addition, as a comparative example, there was produced a cylindrical body formed with grooves each having a sectional profile defined by a circle which is 10 mm in diameter, and, the collar portion of the case and the base body were welded to each other by means of resistance welding.

Lastly, a DC electric field of 3 kV/mm has been applied to two lead pins of each cylindrical-body sample for 20 minutes to effect polarization, whereupon piezoelectric actuator production was completed.

As the result of application of a DC voltage on each of the piezoelectric actuators thusly obtained, all the piezoelectric actuators exhibited displacement in the stacking direction.

Moreover, the piezoelectric actuators were subjected to 1000000-cycle continuous driving test in conditions of an environmental temperature of 80° C., a voltage of 150 V, a frequency of 100 Hz, and a square wave of Duty 50.

As a result, the piezoelectric actuator of the invention was found to show little change in the amount of displacement even after the 1000000-cycle continuous driving test, to retain the effective displacement necessary for a piezoelectric element, to be free from separation at the junction, and to afford a steady amount of displacement even after long-time use.

On the other hand, the piezoelectric actuator implemented as the comparative example came to a stop following the completion of 120000 cycles of continuous operation. The examination of this sample showed that interfacial separation took place at the junction, and that a crack was developed in the piezoelectric element due to uneven load application entailed by separation of the junction.

REFERENCE SIGNS LIST

1: Piezoelectric element
11: Piezoelectric layer
12: internal electrode layer
13: Active section
14: Inactive section
15: External electrode
16: Lead wire
17: Solder
18: Cover layer
2: Base body
3: Case
30: Cylindrical body
31: Cylindrical portion
32: Collar portion
33: Lid member
310, 311: Groove
312: Cylindrical main body
41: Lead pin
42: Soft glass
5: Insulating member
6: Mass flow controller
61: Flow channel
611: Inlet
612: Outlet
62: Flow sensor section
63: Flow control valve
64: Control circuit section

The invention claimed is:

1. A piezoelectric actuator, comprising:
a piezoelectric element;
a base body having an upper surface which is in contact with a lower end portion of the piezoelectric element; and
a case having an inner surface which is in contact with an upper end portion of the piezoelectric element, the case storing the piezoelectric element therein,
the upper surface of the base body and the case being joined to each other,
the case including
a cylindrical portion including a cylindrical main body and a plurality of grooves formed all around a perimeter thereof, and
a collar portion disposed at a lower end side of the cylindrical portion,
at least two or more of the plurality of grooves having a sectional profile taken along a plane perpendicular to a vertical direction whose oblate ratio differs from that of a sectional profile of the cylindrical main body, wherein the oblate ratio is a difference between a major radius and a minor radius divided by the major radius, and
wherein the two or more of the plurality of grooves each having a sectional profile whose oblate ratio differs from that of the sectional profile of the cylindrical main body, vary in terms of orientation of a major axis of the sectional profile.

2. The piezoelectric actuator according to claim 1, wherein the sectional profiles of the grooves whose oblate ratio differs from that of the sectional profile of the cylindrical main body, are an ellipse.

3. The piezoelectric actuator according to claim 2, wherein the cylindrical main body has a sectional profile of an ellipse.

4. A mass flow controller, comprising:
a flow channel;
a flow sensor section configured to detect a flow rate of a fluid flowing through an interior of the flow channel;
a flow control valve provided with the piezoelectric actuator according to claim 1, the flow control valve controlling a flow rate of a fluid; and
a control circuit section,
the flow control valve exercising flow rate control by exploiting expansion and contraction of the piezoelectric actuator.

* * * * *